US012165835B2

(12) United States Patent
Janssen et al.

(10) Patent No.: US 12,165,835 B2
(45) Date of Patent: Dec. 10, 2024

(54) STROBOSCOPIC ILLUMINATION SYNCHRONIZED ELECTRON DETECTION AND IMAGING

(71) Applicant: FEI Company, Hillsboro, OR (US)

(72) Inventors: Bart Jozef Janssen, Eindhoven (NL); Gerard van Veen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 124 days.

(21) Appl. No.: 17/564,154

(22) Filed: Dec. 28, 2021

(65) Prior Publication Data

US 2022/0208510 A1    Jun. 30, 2022

Related U.S. Application Data

(60) Provisional application No. 63/132,411, filed on Dec. 30, 2020.

(51) Int. Cl.
*H01J 37/26* (2006.01)
*H01J 37/147* (2006.01)
*H01J 37/244* (2006.01)

(52) U.S. Cl.
CPC ........ *H01J 37/265* (2013.01); *H01J 37/1472* (2013.01); *H01J 37/244* (2013.01);
(Continued)

(58) Field of Classification Search
CPC .. H01J 37/00; H01J 37/02; H01J 37/26; H01J 37/265; H01J 37/1472; H01J 37/244;
(Continued)

(56) References Cited

U.S. PATENT DOCUMENTS 4,328,182 A * 5/1982 Blake ................... G01N 31/226
  436/1
4,382,182 A * 5/1983 Matsuzaka ............. H01J 37/28
  250/397
(Continued)

OTHER PUBLICATIONS

Abbas, et al., "Dual Layer 3D-Stacked High Dynamic Range SPAD Pixel," International Image Sensor Workshop, 4 pages (Jun. 25, 2019).
(Continued)

*Primary Examiner* — Jason L McCormack
(74) *Attorney, Agent, or Firm* — Klarquist Sparkman, LLP (57) ABSTRACT

An apparatus includes an electron source coupled to provide an electron beam, a beam deflector arranged to provide a pulsed electron beam from the electron beam, a detector arranged to receive the pulsed electron beam after transmitting through a sample, and a controller coupled to control at least the beam deflector and the detector, the controller coupled to or including code that, when executed by the controller, causes the apparatus to establish the pulsed electron beam with pulse characteristics based on control of at least the beam deflector, wherein an illumination window is formed based on the pulse characteristics, the illumination window being a time frame when the sample is illuminated with a pulse of the pulsed electron beam, and to form a detection window for the detector and synchronize the detection window in relation to the illumination window, wherein detection events occurring in the detection window form the basis of an image, wherein the detection window determines a time frame when the detector converts the pulse of the pulsed electron beam transmitted through the sample to an electron induced signal.

21 Claims, 5 Drawing Sheets

(52) U.S. Cl.
CPC ............... *H01J 2237/2441* (2013.01); *H01J 2237/2445* (2013.01)

(58) Field of Classification Search
CPC ............ H01J 37/28; H01J 2237/2441; H01J 2237/2445; H01J 2237/0432; H01J 2237/245
USPC .......................................... 250/306, 307, 311
See application file for complete search history.

(56) References Cited

U.S. PATENT DOCUMENTS

| | | |
|---|---|---|
| 8,450,820 B2 | 5/2013 | Nanver et al. |
| 2007/0216428 A1* | 9/2007 | Schmid ................ G01R 31/305 324/754.22 |
| 2009/0116363 A1* | 5/2009 | Watanabe .......... G11B 7/24006 |
| 2021/0090846 A1* | 3/2021 | Liu ......................... H01J 37/21 |

OTHER PUBLICATIONS

Bruschini et al., "Single-photon avalanche diode imagers in biophotonics: review and outlook," Light: Science & Applications (Sep. 2019).

Gallivanoni et al., "Progress in Quenching Circuits for Single Photon Avalanche Diodes," *IEEE Transactions on Nuclear Science*, vol. 57, No. 6 (Dec. 2010).

Hoischen et al., "Fast timing with plastic scintillators for in-beam heavy-ion spectroscopy," *Nuclear Instruments and methods in Physics Research A*, 654(1):354-360 (Oct. 21, 2011).

Hutchings, "A Reconfigurable 3-D-Stacked SPAD Imager With In-Pixel Histogramming for Flash LIDAR or High-Speed Time-of-Flight Imaging," *IEEE Journal of Solid-State Circuits*, 54(11):2947-2956 (Nov. 2019).

Maruyama et al., "A 1024 x 8, 700-ps Time-Gated SPAD Line Sensor for Planetary Surface Exploration With Laser Raman Spectroscopy and LIBS," *Journal of Solid-State Circuits*, 49(1):1-11 (Jan. 2014).

Zhao, et al., "Development of a fast plastic scintillation detector with time resolution of less than 10 ps," *Nuclear Instruments and Methods in Physics Research A*, 823 41-46 (Jan. 2016).

"Stroboscopic Continuous Tilt Tomography in a Transmission Electron Microscope," Research Disclosure, available at: www.researchdisclosure.com, 3 pages (Oct. 2017).

* cited by examiner

STROBOSCOPIC ILLUMINATION SYNCHRONIZED ELECTRON DETECTION AND IMAGING

CROSS REFERENCE TO RELATED APPLICATION

This application claims the benefit of U.S. Provisional Patent Application No. 63/132,411, filed Dec. 30, 2020, and is incorporated by reference herein.

FIELD

The disclosure pertains, in general, to charged particle beam microscopy, and, in particular, to detection methods synchronized to stroboscopic illumination.

BACKGROUND

Electron microscopes have used photographic plates and CCD sensors in the past. For individual electron counting, CMOS sensors have been used. More recently, sCMOS sensors have been used to improve imaging frame rates and noise levels. These sensors use photo diodes to convert part of the energy of a primary electron that traverses the sensor into (a variable amount of) free charge carriers. The free charge carriers are collected and subsequently measured. In the case of electron counting, a decision is made (off-chip) based on the measurements about whether a primary electron being the cause of the measured signal. The ability to make a reliable decision depends on the accuracy of the measurement, of which readout noise is a specific important component. This noise increases with decreasing measurement time, resulting in a physical limit on the detection rate. For example, count rates for sCMOS sensors for electron detection are generally limited to the range of 10-100 counts per second (cps) per pixel, though some thicker devices can detect many more events per pixel per second. However, for thicker devices, the counting process can be generally considered implicit, as essentially all energy of the primary electrons is converted and measured. Overall, a need remains for improved electron microscopes sensors and sensing techniques, in particular for individual electron counting, along with ways to reduce noise and improve image quality.

SUMMARY

According to another aspect of the disclosed technology, apparatus include an electron source coupled to provide an electron beam, a beam deflector arranged to provide a pulsed electron beam from the electron beam, a detector arranged to receive the pulsed electron beam after transmitting through a sample, and a controller coupled to control at least the beam deflector and the detector, the controller coupled to or including code that, when executed by the controller, causes the apparatus to establish the pulsed electron beam with pulse characteristics based on control of at least the beam deflector, wherein an illumination window is formed based on the pulse characteristics, the illumination window being a time frame when the sample is illuminated with a pulse of the pulsed electron beam, and to form a detection window for the detector and to synchronize the detection window in relation to the illumination window, wherein detection events occurring in the detection window form the basis of an image, wherein the detection window determines a time frame when the detector converts the pulse of the pulsed electron beam transmitted through the sample to an electron induced signal. In some apparatus examples, the code that, when executed by the controller, causes the apparatus to synchronize a detection window of the detector with the illumination window further includes code that, when executed by the controller, causes the apparatus to temporally space the detection window apart from the illumination window by at least a portion of a delay, the delay corresponding to a propagation time of a transmitted electron beam pulse propagating from the sample to the detector. In some examples, the delay is configured to suppress spurious signal detection not directly associated with a primary impact of the transmitted electron beam pulse. In some examples, the detector includes one or more single-photon avalanche photodiode (SPAD) detector elements. In selected examples, the SPAD detector elements comprise a pixelated imager or a pixel array. In some examples, the detection events have respective timestamps and wherein the code that, when executed by the controller, causes the apparatus to compare the timestamps of one or more of the detection events to delayed timestamps of one or more of the illumination windows, wherein the delayed timestamps correspond to the timestamps of the one or more illumination windows plus the delay, and to associate with the image only those detection events that are within the delayed timestamps of the one or more illumination windows. In some examples, the detection events have respective timestamps and wherein the code that, when executed by the controller, causes the apparatus to compare the timestamps of one or more of the detection events to timestamps of one or more of the detection windows, and to associate with the image only those detection events that are within the timestamps of the one or more detection windows. In some examples, the code that, when executed by the controller, causes the apparatus to synchronize a detection window of the detector with the illumination window further includes code that, when executed by the controller, causes the apparatus to temporally space a scatter-based detection window apart from the illumination window by at least a portion of a second delay, the second delay corresponding to an onset of scattered particles arriving at the detector, wherein detection events occurring in the scatter-based detection window form the basis of a scatter image. In some examples, the code that, when executed by the controller, causes the apparatus to synchronize a detection window of the detector with the illumination window, further includes code that, when executed by the controller, causes the apparatus to temporally space the detection window apart from the illumination window by at least a portion of a delay, the delay corresponding to an onset of scattered particles arriving at the detector, to form a scatter-window based detection window. In some examples, the code that, when executed by the controller, causes the apparatus to synchronize a detection window of the detector with the illumination window, further includes code that, when executed by the controller causes the apparatus to generate a signal with the detector only during the detection window. In some examples, the code that, when executed by the controller, causes the apparatus to synchronize a detection window of the detector with the illumination window, further includes code that, when executed by the controller, causes the apparatus to terminate the detection window before particles scattered from surfaces of the apparatus in association with the transmission of the electron beam pulse during the illumination window become received by the detector. In some examples, the code that, when executed by the controller, causes the apparatus to synchronize a detection window of the detector with the illumination window, further includes code that, when executed by the controller, causes the apparatus to provide the illumination window with a duration selected in relation to a delay between an onset of the detector receiving particles scattered from surfaces of the apparatus in association with the transmission of the electron beam pulse during the illumination window, such that an end of the detection window is selectable to occur before the onset. In some examples, the beam deflector is coupled to deflect the electron beam relative to an aperture to produce the pulsed electron beam at a pulse rate. In some examples, the beam deflector includes a resonant RF cavity. In some examples, the beam deflector is configured to provide the illumination windows with a duration of less than 1 ns, less than 500 ps, less than 100 ps, or less than 50 ps. In some examples, the beam deflector includes beam blankers. In some examples, the detector includes counter circuitry configured to record detected counts over a series of the detection windows. Some examples further include a pulse signal source coupled to or part of the controller, wherein the pulse signal source is configured to define pulse characteristics of the pulsed electron beam provided by the beam deflector.

According to another aspect of the disclosed technology, methods include providing an electron beam with an electron beam source, producing a pulsed electron beam from the electron beam using a beam deflector, establishing the pulsed electron beam with pulse characteristics based on control of at least the beam deflector, wherein the pulse an illumination window is formed based on the pulse characteristics, the illumination window being a time frame when a sample is illuminated with a pulse of the pulsed electron beam, forming a detection window for a detector and synchronizing the detection window in relation to the illumination window, wherein detection events occurring in the detection window form the basis of an image, wherein the detection window determines a time frame when the detector converts the pulse of the pulsed electron beam transmitted through the sample to an electron induced signal, and detecting the pulsed electron beam after transmission through the sample. In some examples, the synchronizing the detection window includes temporally spacing apart the detection window from the illumination window by at least a portion of a delay corresponding to a propagation time of a transmitted electron beam pulse propagating from the sample to the detector.

According to another aspect of the disclosed technology, a computer readable medium comprising computer executable instructions for a processor to, when providing an electron beam with an electron beam source and producing a pulsed electron beam from the electron beam using a beam deflector so that the pulsed electron beam is detected with a detector after transmission through a sample: establish the pulsed electron beam with pulse characteristics based on control of at least the beam deflector, wherein an illumination window is formed based on the pulse characteristics, the illumination window being a time frame when the sample is illuminated with a pulse of the pulsed electron beam, and form a detection window for the detector and synchronize the detection window in relation to the illumination window, wherein detection events occurring in the detection window form the basis of an image, wherein the detection window determines a time frame when the detector converts the pulse of the pulsed electron beam transmitted through the sample to an electron induced signal.

The foregoing and other features, and advantages of the disclosed technology will become more apparent from the following detailed description, which proceeds with reference to the accompanying figures.

DETAILED DESCRIPTION

TEM imaging can suffer from noise of various forms, which manifests in myriad ways. The noise can be even more bothersome at the extreme resolutions currently available in TEMs. For example, electrons reflected around inside of a TEM chamber or microscope column can affect image quality even at the low incident rates of such noise. While prior attempts to reduce electron-reflection based noise have been attempted, such coatings or inserts made of materials intended to reduce such reflections, these attempts still do not provide the reduction of noise as needed.

Additionally, existing CMOS based sensors suffer from limited count rates, which can substantially limit the capability of electron microscopes. In such sensors, noise substantially increases as the measurement rates decrease, effectively preventing further decreases in measurement rates and any potential advantages that might be obtained from the shorter measurement times. Additionally, dark count-rates (DR, ~200 cps) of detectors can be an added noise problem, where the DR is a measure of sensor data not associated with a corresponding detection event. For example, if a rate of received particles is relatively low, it can be difficult to discern electron induced signal from noise events, e.g., DR and/or reflected electrons. As such, solutions to further reduce the effect reflected electrons and/or DR have on image quality and noise are desired.

One solution involves synchronizing detection times with sample illumination times, e.g., pulses, so that data is only collected and/or analyzed in reference to a time a sample is illuminated. For example, a single-photon avalanche photodiode (SPAD) detector may be configured to detect a pulsed interrogation beam (such as formed from electrons or other charged particles) during a timed window, where the timing of the window is based on the timing of the interrogation pulses. The time resolution of SPAD detectors and the stroboscopic, e.g., pulses, delivery of the interrogation beam can be leveraged to improve image generation. This can be achieved in various disclosed examples by reducing or preventing detection of spurious events generated by these aforementioned processes such as scatter and dark counts by using timing characteristics of SPAD-based detectors with stroboscopic illumination of a target sample. While SPAD-based detectors are used to illustrate the disclosed techniques, it should be understood that any time-sensitive sensor is contemplated within the bounds of the present disclosure and that the use of the SPAD detectors as an illustrative example sensor is not limiting.

In some examples, stroboscopic illumination is synchronized with a gating signal of a SPAD-based detector. For example, SPAD-based detectors can disable detection by preventing charge-carrier multiplication from occurring, or by using local or global shutters to prevent pixels from detecting incoming electrons outside of a synchronized detection time. In further examples, instead of or in addition to gating, the exact time-stamp of every detected event can be recorded and events that are recorded too long after or before the illumination occurred can be subsequently dropped, e.g., in post-processing. In some examples, a rate of spurious events is reduced by the fraction of time the illumination is active. In further examples, a spurious event rate is reduced by a fraction of time the detection window is active. Example SPADs can achieve a time-resolution in the range of 10-100 ps.

In other embodiments, SPADs can use scintillators for indirect detection. Scintillators can achieve a time resolution of less than about 10 ps, which can allow the time resolution of the indirect detector to be largely determined largely by the time resolution of the SPAD. Such time resolutions can allow for masking of scatter signal generated from further away than 2-20 mm below the sensor.

Figure 1:
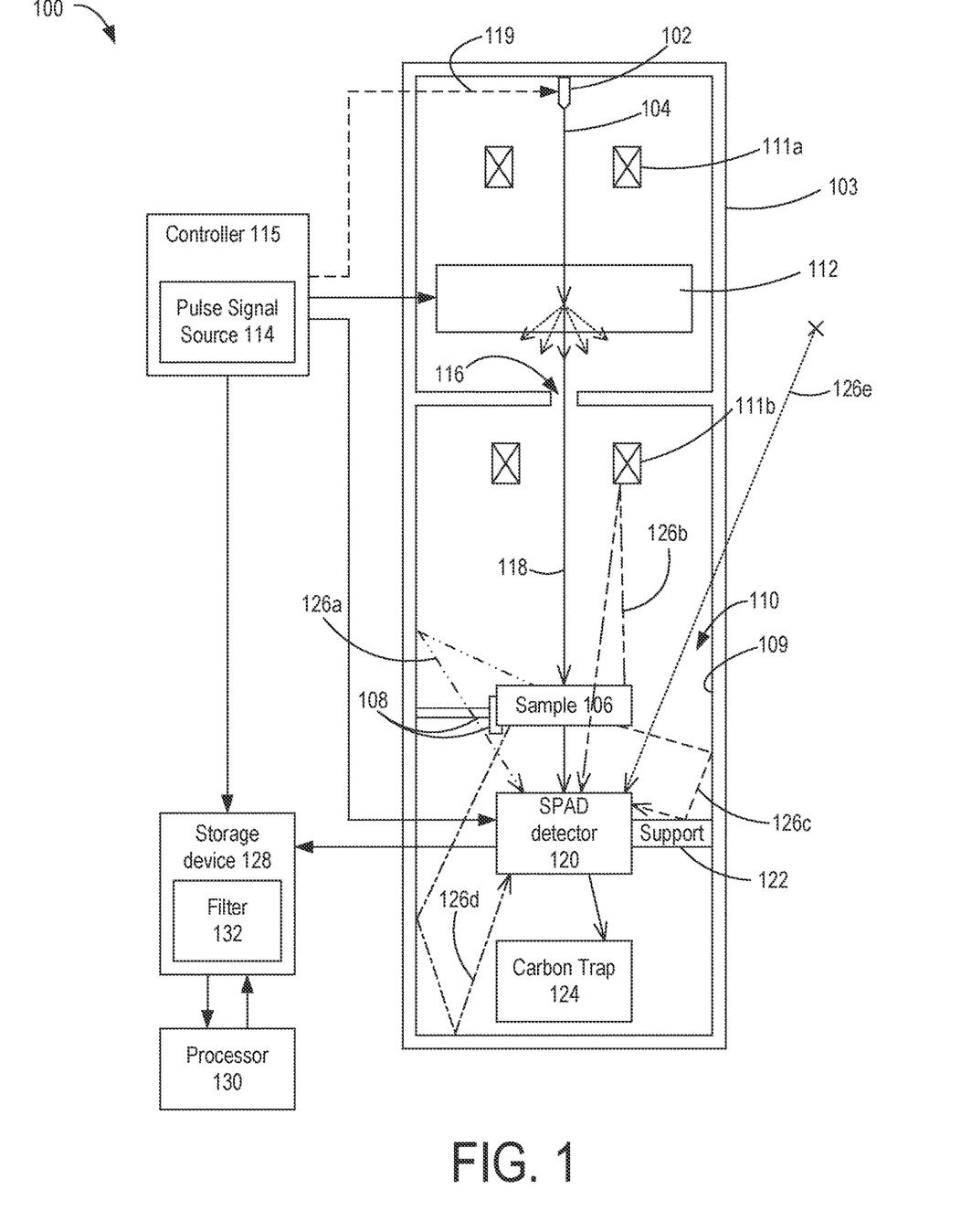
FIG. 1 is a schematic of an example charged particle beam microscope having a SPAD detector.

FIG. 1 shows an example charged particle microscope 100, such as a transmission electron microscope (TEM), in accordance with an embodiment of the present disclosure. Other suitable microscope examples can include SEMs, FIBs, STEMs, etc. The microscope 100 can include other types of electron microscopes and charged particle microscopes. The microscope 100 includes a charged particle source, such as an electron source 102, and column 103 housing various components that direct an electron beam 104, produced by the electron source 102, to a sample 106. The sample 106 can be held by a sample holder 108 situated in a sample chamber 110 having one or more interior surfaces 109. The microscope 100 also includes a pulse generator configured to generate a pulsed electron beam 118 that is received by the sample 106. The components that direct the electron beam 104 and/or pulsed electron beam 118 can include lenses 111a, 111b (e.g., electrostatic and/or magnetic lens elements) that can focus and/or manipulate the characteristics of the electron beam 104 and/or pulsed electron beam 118 as it propagates towards the sample 106. In some examples, the pulse generator can include a beam deflector 112 configured to deflect the beam 104 across a range of directions (depicted with multiple dashed arrows). Additionally, the beam deflection can result in electron pulses, discussed further hereinbelow.

In representative examples, the beam deflector 112 can be a resonant RF cavity, electrostatic lens configured to provide beam deflection at one or more predetermined frequencies, or a pump probe source (such as a mode-locked laser) to cause the electron beam source 102 to generate electron pulses with pulse characteristics, such as pulse duration and pulse frequency (repetition rate). Electron pulses are generally defined as one or more electrons generated during a time period and initially directed in one or more selected directions. The resonant RF cavity can be configured to move a passing electron beam 104 across an aperture, such as aperture 116, to produce the pulsed electron beam 118 at a desired pulse rate and width. Suitable pulse rates and pulse widths (duration) can be configured to be fixed, variable, or a combination. Thus, pulses of varying length can be provided, including with non-uniform intervals. The RF cavity can be operated in a single or dual mode based on a desired pulse rate (e.g., pulse frequency) of the pulsed electron beam 118. In other embodiments, beam deflector 112 may include beam blankers that deflect the passing beam across, e.g., out of, the aperture at a rate to provide (at least in part) the desired pulse rate to the pulsed electron beam 118. Alternatively, pulse generators can include pump-probe generators, such as where the pulsed electron beam may be formed directly by the electron source 102 using a pump-probe to generate the electron pulses at the desired frequency/pulse rate. Regardless of embodiment, microscope 100 provide a pulsed electron beam 118 to the sample 108 at a desired frequency/pulse rate.

A microscope controller 115 can include or be coupled to a pulse signal source 114 to generate one or more pulse generation signals, such as beam deflection signals that define characteristics of the beam deflection for the beam deflector 112. By way of example, characteristics of beam deflection can include one or more beam deflection frequencies, pulse rate and/or pulse width. As the electron beam 104 is deflected across aperture 116, an electron pulse of the pulsed electron beam 118 is formed by transmission through the aperture 116, typically at a repetition rate defined at least in part by the beam deflection characteristics provided with the controller 115 and/or pulse signal source 114. In an example, the pulses of the pulsed electron beam 118 can be transmitted through the aperture 116 twice for each cycle of the beam deflection at a beam deflection frequency. In such an example, the transmission can occur beginning at equally spaced phase positions (or other predetermined phase spacing) of the period of the beam deflection cycle, with the beam 104 being blocked during the remainder of the beam deflection cycle. In further examples, more complex deflections can be formed, such as by applying 2D deflection frequencies with a resonant RF cavity operating in multi-mode configuration, e.g., to vary pulse repetition rate and pulse duration separately, such as by decreasing the pulse repetition rate without increasing the pulse duration.

In some pulse generator examples, the electron pulses of the pulsed electron beam 118 can be created with a short pulse duration by directing a pulsed excitation beam 119, synchronized with the pulse signal source 114, to the electron beam source 102. For example, pump-probe techniques used in pump-probe microscopy can be used to generate a suitable pulsed excitation beam (e.g., by frequency up-converting a laser beam to a sufficient wavelength such as ultraviolet) and to direct the pulsed excitation beam to the electron beam source 102 to produce a pulsed emission. By way of example, pump-probe sources can generate electron pulses with 0.1 to about 100 electrons per pulse, which can be suitable in various sample imaging applications with the detector 120.

The pulsed electron beam 118 can be generated by transmitting the electron beam 104 through the aperture 116 for a duration of time based on the deflection characteristics of the beam deflector 112 (or other pulsing source such as a pump-probe source), to define an electron pulse duration. The length of the electron pulse duration can correspond to a duration of a stroboscopic illumination window, which is based on the time the electron pulse of the pulsed electron beam 118 transmits through the sample 106 (discussed hereinbelow). The beginning of the illumination window can be delayed relative to the timing of the transmission through the aperture 116 due to the propagation time of the electron pulse from the aperture 116 to the sample 106. In some examples, the duration of the illumination window can be determined in part from the width of the aperture in the direction the beam deflection and the characteristics of the beam deflection provided by the beam deflector 112. In some examples, the controller 115 and/or pulse signal source 114 can include one or more tunable signal generators. The beam deflector 112 can include or be coupled to a power amplifier (not shown) for amplifying the signal driving the beam deflector 112. Example beam deflection frequencies can be in the GHz range, e.g., 1 kHz, 100 kHz, 1 MHz, 100 MHz, 0.5 GHz, 1 GHz, 2 GHz, 3 GHz, 4 GHz, 10 GHz, etc., though there is not a particular lower limit to the frequencies that can be provided. As discussed above, the deflection frequency or frequencies of the beam deflector 112 can be different from the repetition rate or frequency at which the sample 106 is illuminated by electron pulses.

As discussed above, the pulses of the pulsed electron beam 118 (which can also be referred to as electron pulses, pulsed beam, pulsed beam portion, etc.) propagates through the sample 106 during the illumination window. The pulsed beam portion 118 then propagates further and reaches a detector 120 situated in the cavity, e.g., coupled within the chamber 110 by a support 122, where the pulsed beam portion 118 can be detected. In representative examples, the detector 120 can include a single-photon avalanche photodiode (SPAD) detector in various configurations. In further alternative examples, the detector 120 can be a large area avalanche photodiode (LA-APD) or other detector with sufficiently short time interval and corresponding high time resolution. By way of example, SPAD detector configurations can include a detector including a solitary SPAD detector element, a linear array of SPAD detector elements, a 2D array of SPAD detector elements, an imager formed from SPAD detector elements, pixelized arrays of SPAD detector elements, SPAD detector elements with localized counter circuitry (e.g., for histogram counting, e.g., without a processor or processor-executable instructions), localized quenching circuitry, etc. In some SPAD detector array examples, a pixel can include a plurality of SPAD detector elements that can be configured to detect at different times during a detection window (discussed hereinafter). For example, one SPAD detector element can provide detection capability at a later time during a detection window after another SPAD detector element has detected and is undergoing quenching or resetting. Some of the particles from the pulsed beam portion 118 that are not detected can propagate past detector 120 and become absorbed and trapped by a carbon kit 124 comprising one or more layers of carbon. Some of the pulsed beam portion 118 can be scattered within the chamber, e.g., from the sample 106, detector 120, support 122, surface 109, etc., as depicted by rays 126a-126d. Other sources of scatter or spurious particle presence can occur, such cosmic ray 126e, as well as after-pulsing or dark counts originating within the detector 120. Other scatter sources within the chamber 110 can include movement stages, other detectors, vacuum components, electronics, etc. Scatter noise can also include secondary particles that are emitted, including back-scattered electrons, ion emissions, cathodoluminescence, fluorescence, phosphorescence, etc. In representative examples, detected pulses consist of a set of primary electrons that each get detected and localized.

In selected examples, the controller 115 and/or pulse signal source 114 can also be coupled to the detector 120 to cause the detector 120 to generate a signal only during a detection window. For example, detection capability of the detector 120 can be enabled for a detection window duration that is defined relative to phase positions of the period of the beam deflection signal at the beam deflection frequency. In some examples, an internal shutter can be closed or disabled, or transfer operations are not performed outside of the detection window. In some examples, the controller, pulse signal source 114, or another coupled component can produce a gate signal comprising a series of detection windows during which the detector 120 is enabled to produce an electron induced signal. The detection window is a time-frame in which the detector 120 is enabled to detect incoming radiation and provide a corresponding output. Detection windows can initiate at a predetermined time based on beam deflection times and/or an illumination window. In general, it is desirable to synchronize the detection windows with a time the electrons will be arriving at the detector, which will include the moment the pulse is generated and the travel time of the electrons through the column and sample and their arrival at the detector 120. In some embodiments, a delay relative to a phase of the beam deflection signal and particle incidence at the detector 120 may determine the initiation of the detection window. Detection windows can also be defined relative to various harmonics of the beam deflection frequency, e.g., detecting twice each period, once per period, once every 1.5 periods, once every two periods, etc. With the disabling of the detector 120 timed in relation to the beam deflection and illumination windows of electrons transmitted through the sample, an occurrence of charge-carrier multiplication and corresponding spurious noise events outside of the detection windows can be reduced. Stated another way, by only enabling the detector 120 during a detection window, an overall signal to noise ratio may be increased due to the reduction or prevention of spurious and other noise events adding to the imaging signal. The reduction in spurious noise events allows an improvement in the signal quality of detection, substantially reducing dark counts and scatter noise, and further allowing rapid, repeated detections at high frequencies to rapidly accumulate detection events at short time intervals/high time resolutions. Various gate circuits for SPADs can be employed by those with skill in the art. Examples of the detector 120 can also include one or more quenching circuits configured to quench and reset detection capability.

As particles (e.g., electrons) of the pulsed beam portion 118 that is transmitted through the sample 106 impact different pixels of the detector 120, an electron induced signal can be produced. For example, received electrons can create free charge carriers in a depletion region of a PN junction of the detector 120 through impact ionization. With the PN junction highly reverse biased during the detection window, the charge carriers are accelerated to create an avalanche that produces the electron induced signal. The electron induced signal can be coupled to local counter circuitry (as well as other circuitry such as quenching circuits) and/or remotely to a computing device that includes a storage device 128, such as a computer memory, hard drive, etc., for data storage, image creation, and/or further post-processing with a processor 130. In some examples, the processor 130 and/or storage device 128 can be part of the controller 115.

In some examples, a start time of the detection window at which the detector 120 becomes enabled for detection is delayed relative to a beginning of an illumination window of interrogation particles from the pulsed beam portion 118 received by the sample 106. The delay can be selected in relation to the distance between the sample 106 and the duration of a particle propagating from the sample 106 to the detector 120. For example, for distances ranging from a few cm to tens of cm, propagation times can be tens to thousands of ps. The delay can be provided by the controller 115, pulse signal source 114, or a separate component, and can be adjustable. Example delays can include a sufficient amount of advance, or delay reduction, in relation to the duration defined by the travel distance so that an initial portion of particles of the pulsed beam portion 118 received by the detector 120 does not go undetected. For example, a duration corresponding to 5%, 10%, 50%, etc., of a distance traveled for a photon, electron, or other particle can buffer against system or SPAD detector timing uncertainties, such as SPAD jitter, beam deflector variability, electronics synchronization or phase error, etc. Distances within the apparatus may also be adjusted to affect delay. Illumination window timings can be defined in relation to a phase of the beam deflection signal and the pulsed beam portion 118 that is allowed through the aperture 116. Delays can also be determined heuristically by comparing detection peaks from test illuminations.

As discussed above, the detection windows can be configured to reduce spurious noise events, including detections of undesirable, spuriously scattered portions of the pulsed beam portion 118 (as opposed to desirable transmission which can be in the form of electron scattering, such as elastic scattering). Herein, "scatter" is generally defined as scattered electrons that do not constitute electrons scattered in a normal fashion during transmission through the sample and directly received by the detector 120. In general, the timing of detection window endpoints can correspond to a timing for enabling or disabling the detector 120. In some examples, the detection windows can be selected to terminate before particles undesirably scattered by or produced from the pulsed beam portion 118 interacting with the sample 106 during the illumination window are eventually received by the detector 120. The longer propagation distance and corresponding duration associated with the spurious scatter events allows them to occur after the termination of the detection window. For example, particles scattered off surfaces 109 or other surfaces of the chamber 110 or components situated therein, secondary particles, or other emissions, are more likely to be received by the detector 120 after the selected termination of the detection window. In some examples, the duration of the detection window can match a duration of the illumination window, for example by being the same as, within 1%, 5%, 20%, etc., of the illumination window, though some examples can include non-matching durations. In this way, example illumination windows can have durations selected that are sufficiently short such that an end of a detection window can occur before an onset of scattered particles of the pulsed beam 118 arriving at the detector 120.

Some disclosed examples of the storage device 128 can include a time-based record filter 132, which can be implemented in the form of processor executable instructions for the processor 130, that filters out data from noise during or after image acquisition. It should be noted that the record filter 132 embodiment is used in conjunction of the pulsed beam so that spurious events detected between detection windows can be filtered out of the data. In some examples the record filter 132 can be used instead of gating the detector 120. Use of the record filter 132 can allow an absence of synchronization between the deflection of the beam deflector 112 and the detector 120 in some examples. The record filter 132 can access sets of detector events recorded from the detector 120, where each detector event corresponds to an avalanche occurrence at a particular pixel of the detector 120 during an imaging session.

In some embodiments, each detector event at a pixel can increment an associated counter associated that can be used to form a histogram-based image of the sample 106 over the course of a series of illumination windows or within a single illumination window. In some examples, each of the detector events can include a timestamp which can define its occurrence relative to a phase of the beam deflection signal driving the beam deflector 112 and corresponding timing of the illumination windows, e.g., by collecting timestamps for a particular series of beam deflections or time-distances of event occurrences relative to a sync or reference pulse. Some examples can include a timestamp or identifier of a series position in the series of illumination windows. Using the processor 130 and the record filter 132, the timestamps can be compared in relation to the illumination windows and corresponding projected arrival times for transmitted particles of the pulsed beam portion 118 at the detector 120. The delayed arrival time can define detection windows for the detection events recorded using the detector 120.

Histogram-based images can also be formed or tracked in-part locally to the detector 120 in some examples. For example, detector events can be stored in counter circuits coupled locally (e.g., attached below) to a detection element of the detector 120, such as below or near an avalanche photodiode portion of a detector element in SPAD examples. Counters can be configured to store data for a single detection window or a series of detection windows. In some gated examples, the detector 120 can store a collection of histogram data internally in a memory of the detector 120. For example, all counts can be collected within a certain time distance to a synchronization pulse, e.g., within a detection window. In this way, timestamps are made implicitly by placing counts in histogram buckets defined relative to the synchronization pulse. In further examples, counts can be stored for histogram bins outside of detection windows but then data can be filtered by selecting or reading out data only from those histogram bins that are within selected detection windows. In additional examples, all of the histogram bin data can be read out and filtered (e.g., with record filter 132) external to the detector 120.

In some examples, one or more counters can be coupled to a plurality of pixel elements. In further examples, detector pixels can include a plurality of sub-pixel detection elements configured to provide detection so that if one sub-pixel detection element is triggered, other sub-pixel detection elements are available for detection. For example, a sub-pixel detection element can be triggered-on for detection after another sub-pixel detection element experiences a detection event. In selected examples, different sub-pixels can be gated to provide detection sub-windows that can aggregate to form a detection window, with some sub-windows being spaced apart, adjoining, or overlapping. In representative examples, the field of an impacting electron can extend over two or more sub-pixel elements so that a detection event triggered by one would likely be triggered by another if available for detection.

Calibration and synchronization between the characteristics of the beam deflection (such as frequency and phase) and the illumination and/or detection windows can be obtained through system characterization and test detections. In some examples, beam deflection signal characteristics can be synchronized or locked onto using lock-in detection. In a non-limiting straightforward example, with the detection windows spaced at twice an applied beam deflection frequency, the detection windows can be shifted in time to align with peak detection counts corresponding to the illumination of the sample 106 by the pulsed beam portion 118. In some examples, the detector 120 is not gated or disabled outside of the detection windows, and in other examples a gating can be included to define the detection windows, as discussed previously. In some examples detection window timings and durations can be uniform for each pixel of the detector 120, and in further examples the timings and durations can be non-uniform. Detector events that are outside of the detection windows can be associated with a higher likelihood of originating from scatter, dark counts, after-pulses, etc. After comparing detector event timestamps using the processor 130, detector events having timestamps outside of the detection windows can be removed from the set of detector events to thereby reduce a noise level of the set of detector events. In some examples, filtering or comparisons can be done locally by the detector 120, example with detector counters only counting during certain histogram bins.

Figure 2:
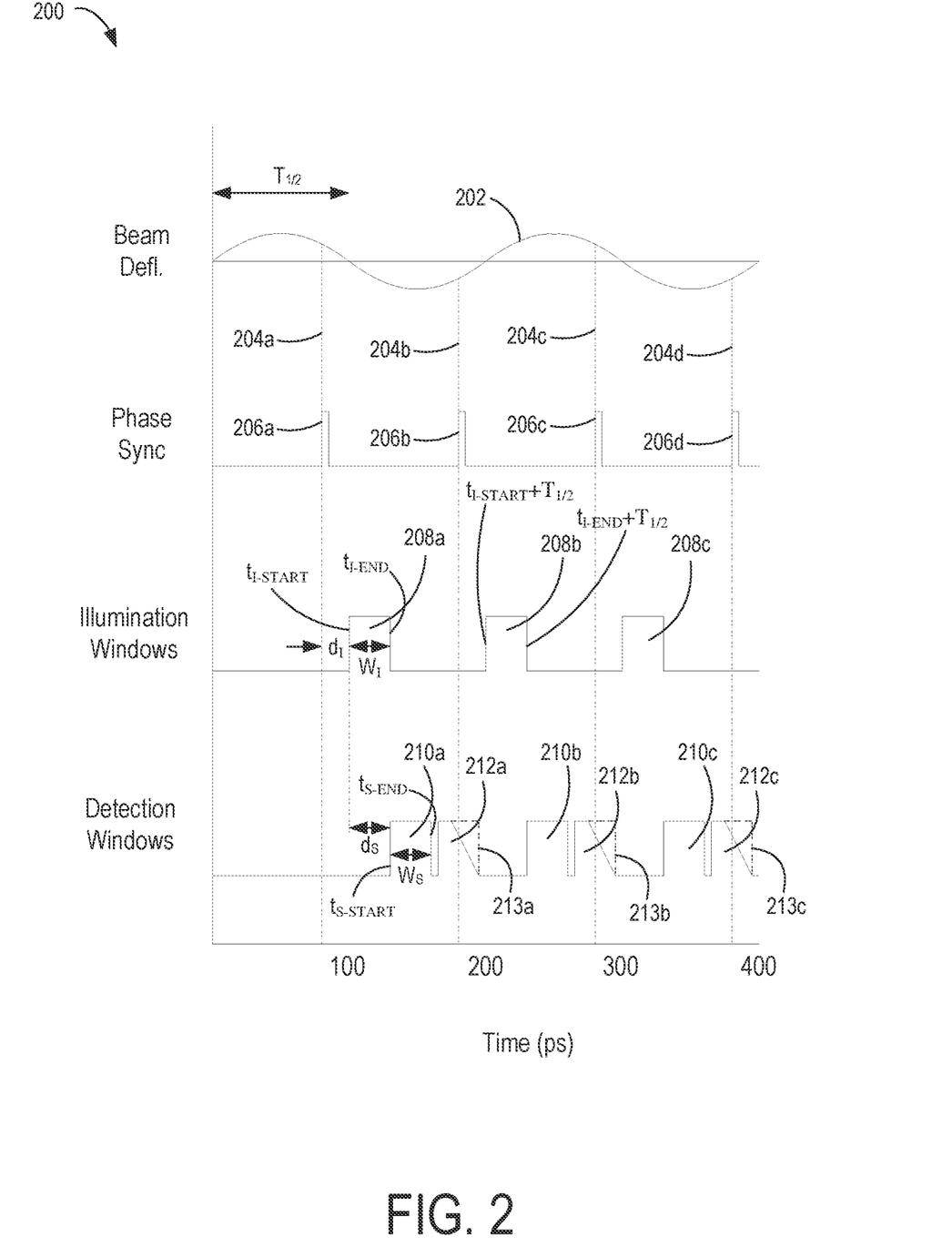
FIG. 2 is a graph depicting operation of charged particle beam microscope examples.

FIG. 2 is an illustrative graph 200 showing an example series of beam deflections and timing/control windows based thereon in accordance with an embodiment of the present disclosure. FIG. 2 can serve as an aid to understanding underlying principles of various disclosed examples, but is not meant to limit any particular example to specific durations, frequencies, timings, or other characteristics shown. Graph 200 includes beam deflection signal 202 deflecting at a beam deflection frequency (e.g., 5 GHz). Each half-period $T_{1/2}$ of the beam deflection signal 202 includes a phase position 204, such as 204a-204d, at which a deflected beam passes over an aperture. As the beam passes over the aperture, such as aperture 116, a beam pulse is transmitted to a sample. In some examples, a pulse synchronization signal 206, such as 206a-206d, can be provided to a detector so that the detector can be gated in relation to a phase, frequency, and/or harmonic of the beam deflection. The transmitted beam portion can have a duration $W_I$ determined by various system parameters, such as aperture size, aperture position, beam deflection frequency, sweep length, etc. The transmitted beam portions can correspond to illumination windows 208a-208c of interrogation particles as received at the sample, which may be delayed by a duration $d_I$ relative to the phase positions 204a-204d based on the propagation distance from the aperture to the sample and speed of the transmitted particles. The illumination windows can have start and end times $t_{I\text{-}START}$, $t_{I\text{-}END}$, respectively.

In reference to the illumination windows 208a-208c, a detector may have a detection window 210, such as detection windows 210a-210c. The detection windows 210a-210c have a duration $W_S$ and can begin at a time $t_{S\text{-}START}$ which can be a time based on the time $t_{I\text{-}START}$ plus a delay $d_S$, with the delay $d_S$ being at least based on the propagation distance from the sample to the detector and speed of the particles exiting the sample. An end time $t_{S\text{-}END}$ can be selected so that scattered electrons that would be detected after the detection window do not contribute to the image data. For example, during scatter windows 212a-212c, which begin after $t_{S\text{-}END}$, particles of the transmitted beam portion that are scattered off one or more surfaces arrive at the detector. As noted, such events increase a noise level if they coincide with image data acquisition. In some examples, the duration $W_I$ of the illumination windows 208a-208c can be selected so that the duration $W_S$ can be limited to end before the onset of the scatter windows 212a-212c. Detection windows $W_S$ can correspond to gated windows in which the detector is enabled. Alternatively, detection windows $W_S$ can be used to differentiate signal associated with an illumination window and signal detected outside of the illumination windows for time-stamp and record-based filtering.

In some examples, detection windows can be defined in relation to the scatter windows 212a-212c so that image data can be collected for the particles of the transmitted beam portion that are scattered off one or more surfaces. For example, initial times of scatter window-based detection windows 213a-213c can correspond to, or be near, the onset of the scatter windows 212a-212c, or at a suitable offset from the onset. Suitable end times of the scatter window-based detection windows 213a-213c can define a suitable short duration for the windows, such as by being defined in relation to a scatter attenuation level (e.g., below 50%, 20%, 5%, 1%, 0.1%, 0%, etc.) or a duration associated with a scatter propagation distance (e.g., in relation to single or multiple reflections off nearby scattering surfaces). Scatter window-based detection windows 213a-213c can also correspond to gated windows in which the detector is enabled or can be used to differentiate signal associated with the illumination window and signal detected outside of the illumination windows for time-stamp and record-based filtering. The collected image data can be used to form an image, e.g., a dual or secondary scatter image, containing scatter information about the sample. In some examples, both detection windows 212a-212c and scatter-window based detection windows 213a-213c can be gated and/or timestamped for collection of both image datas and formation of respective images.

Figure 3:
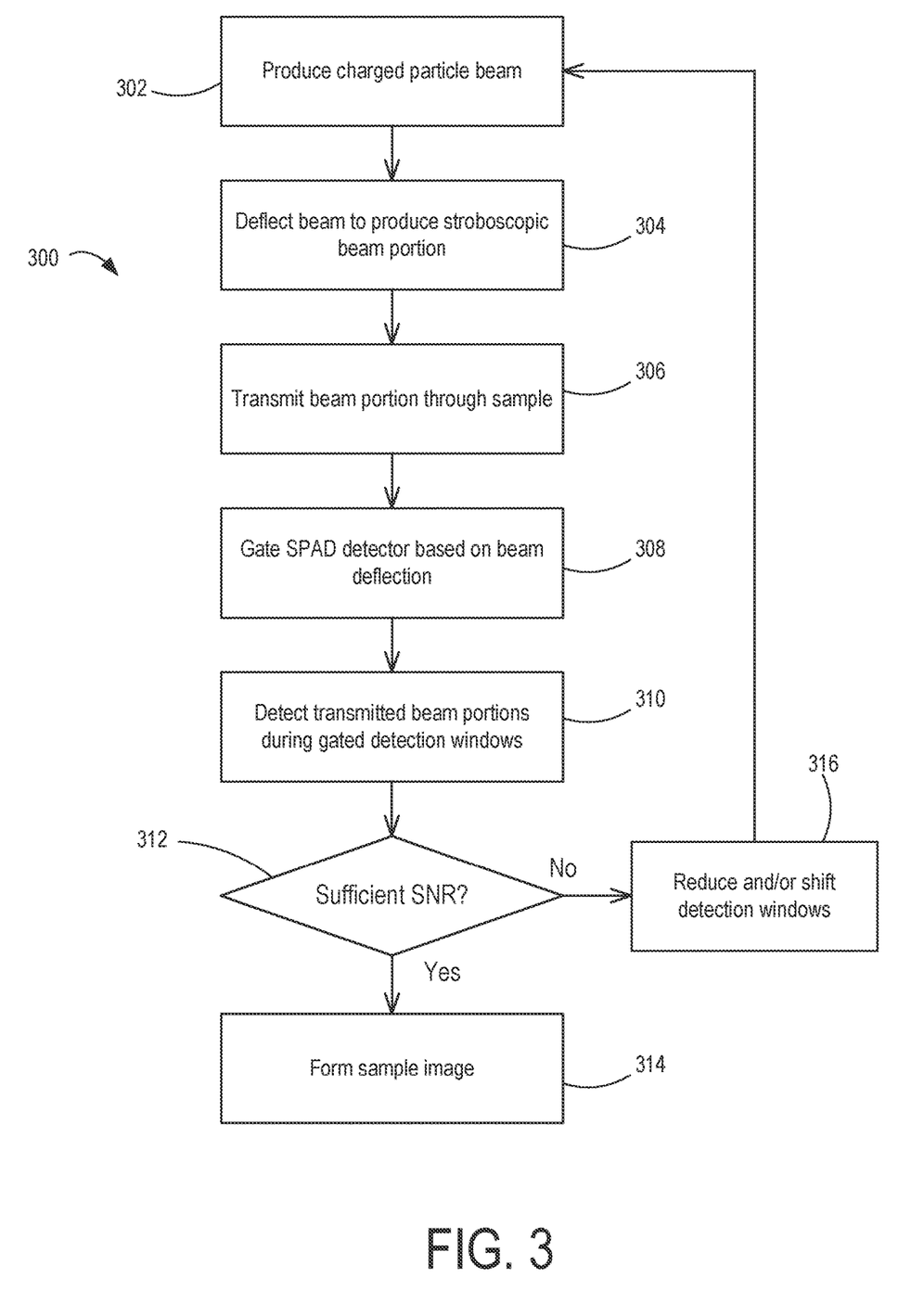
FIG. 3 is a flowchart of a process of forming an image with reduced noise using a gated SPAD detector.

FIG. 3 is an example method 300 that can be used to produce a reduced noise image with a TEM or other charged particle beam microscope by using a detector gated in relation to a stroboscopically delivered charged particle beam. For example, at 302, a charged particle beam, such as an electron beam, is produced. At 304 a stroboscopic beam is provided, such as by directing the charged particle beam through an aperture at a periodic rate. At 306, the beam portion is transmitted, during an illumination window, through a sample situated to receive the beam portion. At 308, a detector (such as a SPAD detector) is gated based on the periodic rate of the beam deflection and the timing of the beam portion transmitted through the aperture. At 310, the beam portion transmitted through the sample propagates to and is received by the detector during a detection window. The timing and duration of the gating can be selected such that the detection window occurs in relation to the illumination window so that the detection occurs during a period of transmitted light received by the detector. The timing and duration is further selected to exclude detection of scattered particles or other noise that may occur outside the period during which the transmitted light is received by the detector. The timing of the illumination window can also be configured with the beam deflection and transmission through the aperture (or other technique for defining the transmitted pulse characteristics) to be of sufficiently short duration such that that the timing and duration of the detection windows can be configured to exclude scatter detection. The process can be repeated numerous times to accumulate detector counts. After a number repetitions, at 312, the collected data can be checked to determine if there is a sufficiently low level of noise, and if it is, then a sample image can be formed at 314. If noise is too high, at 316, the detection windows defined by the gate signal can be adjusted, e.g., by reducing the gate duration and/or shifting the windows relative to the period of the beam deflection and the process can be repeated.

Figure 4:
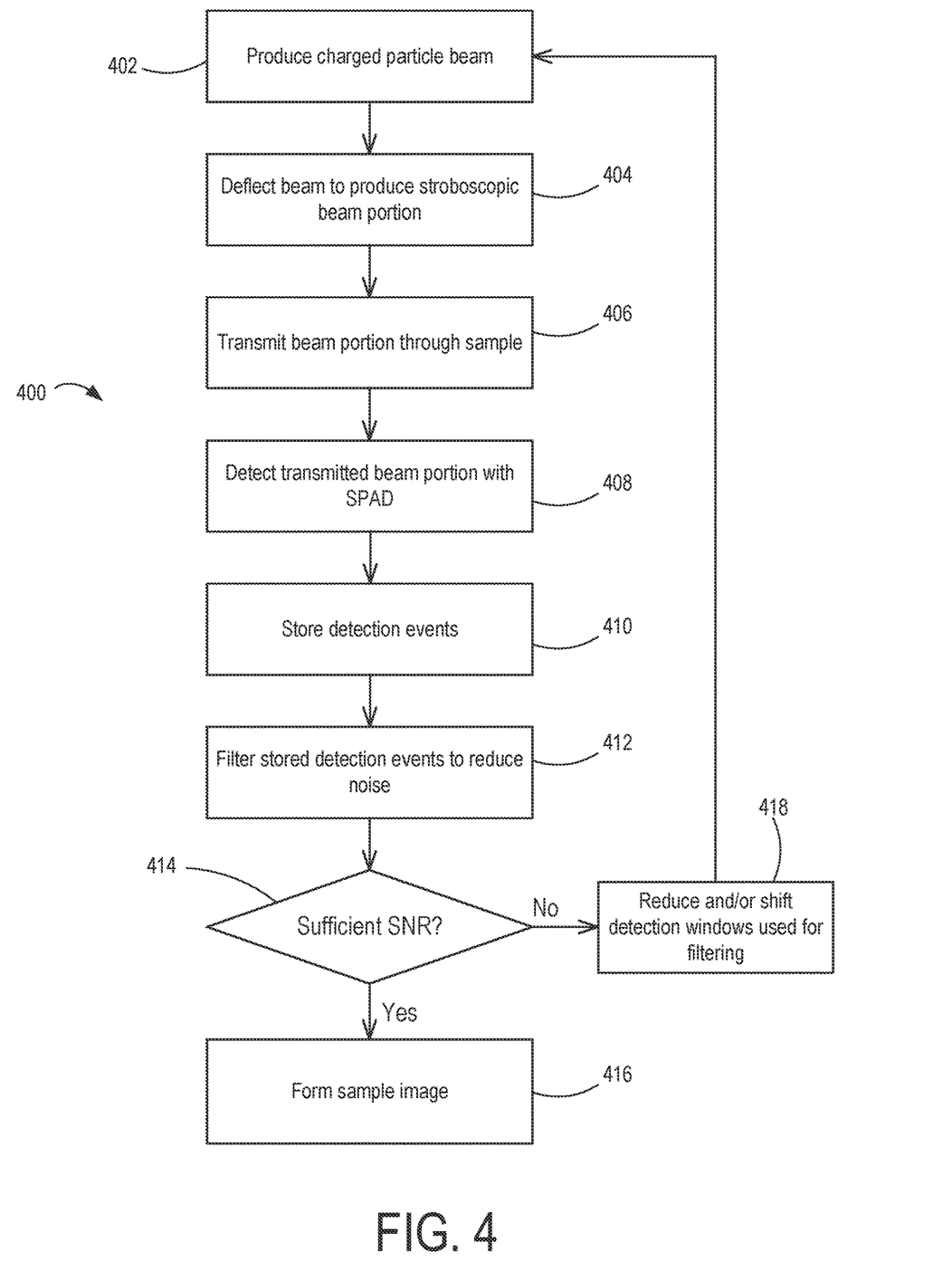
FIG. 4 is a flowchart of a process of forming an image with reduced noise using post-processing to filter spurious SPAD detection events.

FIG. 4 is an example method 400 that can be used to produce a reduced noise image with a TEM or other charged particle beam microscope by filtering detection events (such as SPAD detection events) after detection. For example, at 402, a charged particle beam, such as an electron beam, is produced. At 404 the charged particle beam is deflected with a beam deflector to produce a stroboscopic beam portion that is transmitted through an aperture at a periodic rate. At 406, the beam portion is transmitted through a sample situated to receive the beam portion during an illumination window. At 408, the transmitted beam portion is detected with a detector (such as a SPAD detector) during a detection window, without the detector being disabled (e.g., through a gating) during the detection window. At 410, the detection events can be time-stamped stored on a computer memory (e.g., locally to the detector or externally to a coupled or remote computing device). In some examples, the process of detection can be repeated numerous times to accumulate detector counts that can be placed in histogram bins, e.g., selected in relation to a time resolution of the detector. At 412, the accumulated stored detection events can be filtered so that only counts occurring during a detection window are used for image creation. For example, time-stamped detection events can be filtered with a computer processor, e.g., by removing detection events residing in bins situated outside of a selected detection window aligned with timing of receiving the transmitted beam portion by the detector based on timestamps of the detection events or time-binned relationships if timestamps are not explicitly available. In some examples, filtering can be provided locally by collecting time-stamped counts only during detection windows with counters that are part of the detector, or partly locally by only sending to an external computing device or memory the counts that are time-stamped to occur during the detection windows. At 414, the filtered data can be checked to determine there is a sufficiently low level of noise, e.g., if the detection windows and selected bins are properly aligned with the illumination, and if it is, then a sample image can be formed at 416. If noise associated with scatter or other sources remains present, at 418, the detection windows defined by the filter parameters can be adjusted, e.g., by reducing the detection window duration and/or shifting the windows relative to the period of the beam deflection and the process can be repeated.

Figure 5:
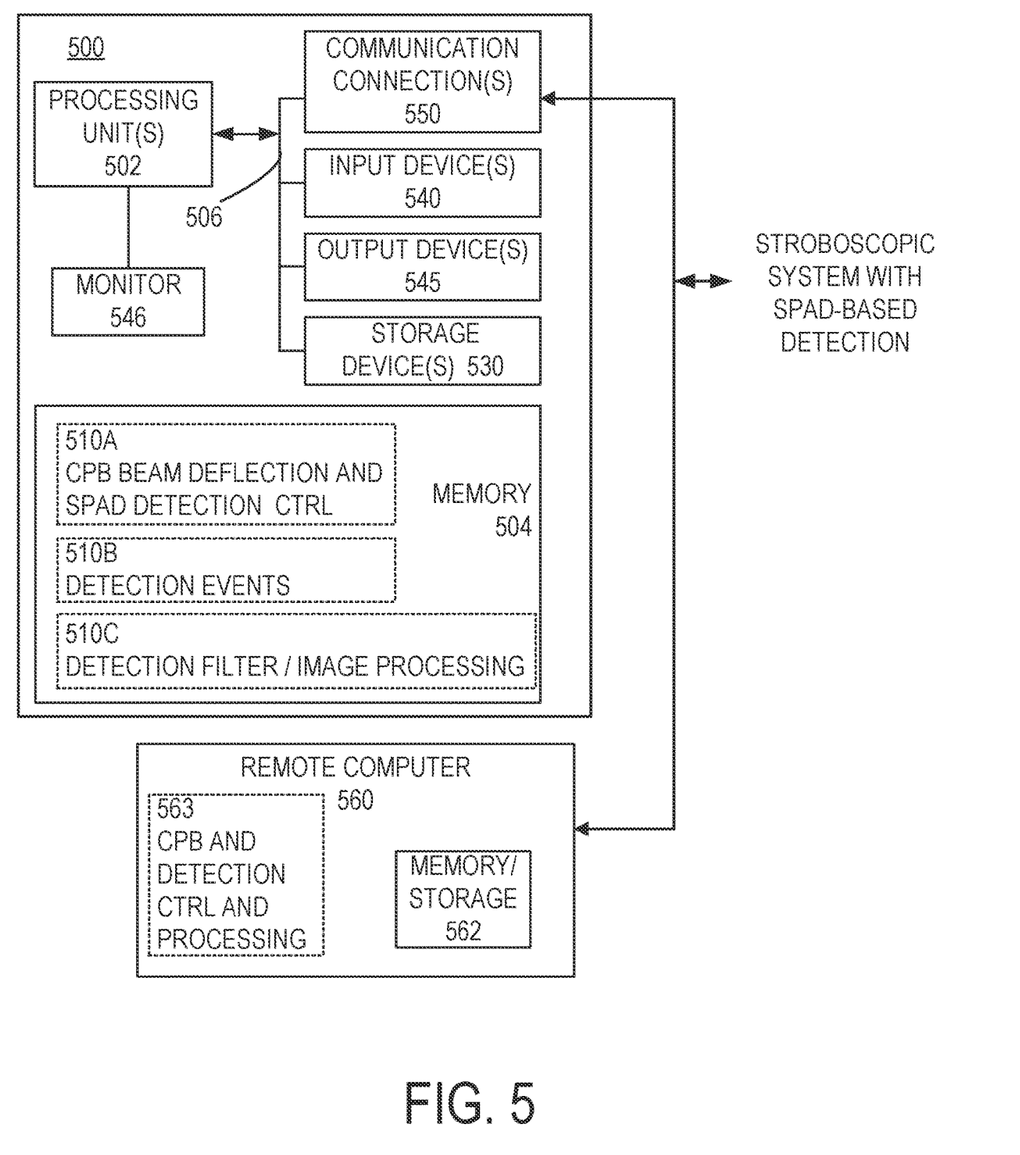
FIG. 5 is a schematic of an example computing environment.

In some examples, charged particle beam emission, beam focusing, beam deflectors, target sample stage manipulation, SPAD gating, SPAD quenching, detection storage, detection event filtering, and image processing are controlled with computer-executable instructions stored in one or more computer readable storage devices either at or near charged particle beam system (such as a TEM) or coupled via a wide area network. FIG. 5 and the following discussion are intended to provide a brief, general description of an exemplary computing environment for controlling these operations. In other examples, individual processor-based controls can be provided for various system functions. The disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 5, an exemplary system for implementing the disclosed technology includes a general purpose computing device in the form of an exemplary computer 500, including one or more processing units 502, a system memory 504, and a system bus 506 that couples various system components including the system memory 504 to the one or more processing units 502. The system bus 506 may be any of several types of bus structures including a memory bus or memory controller, a peripheral bus, and a local bus using any of a variety of bus architectures. In the example of FIG. 5, data and processor-executable instructions for controlling sample imaging, such as beam deflection parameters, synchronization between beam deflection and detection including detection event timestamps, aperture variation, SPAD detector gating, illumination window and detection window adjustment, and sample positioning are stored in a memory 510A. SPAD detection events and processor-executable instruction for filtering the SPAD detection events and forming images are stored in memory portions 510B, 510C, respectively.

The exemplary computer 500 further includes one or more storage devices 530 such as a hard disk drive for reading from and writing to a hard disk, a magnetic disk drive for reading from or writing to a removable magnetic disk, and an optical disk drive. Such storage devices can be connected to the system bus 506 by a hard disk drive interface, a magnetic disk drive interface, and an optical drive interface, respectively. The drives and their associated computer readable media provide nonvolatile storage of computer-readable instructions, data structures, program modules, and other data for the computer 500.

A number of program modules may be stored in the storage devices 530 including an operating system, one or more application programs, other program modules, and program data. A user may enter commands and information into the computer 500 through one or more input devices 540 such as a keyboard and a pointing device such as a mouse. A monitor 546 or other type of display device is also connected to the system bus 506 via an interface, such as a video adapter. Output devices 545 such as printers can also be provided.

The computer 500 may operate in a networked environment using logical connections to one or more remote computers, such as a remote computer 560. In some examples, one or more network or communication connections 550 are included. The remote computer 560 may be another computer, a server, a router, a network PC, or a peer device or other common network node, and typically includes many or all of the elements described above relative to the computer 500, although only a memory storage device 562 has been illustrated in FIG. 5. The computer 500 and/or the remote computer 560 can be connected to a logical a local area network (LAN) and a wide area network (WAN). As shown in FIG. 5, the remote computer 560 includes the memory storage device 562 as well as a memory 563 for data and processor-executable instructions for controlling beam deflection and SPAD detection, detection event storage and filtering, image processing, and other control operations.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

As used herein, "image" refers to a visual display suitable for viewing by an operator, technician, or other person or to data associated with such visual displays. Images thus include data files such as jpg, tiff, bmp, or files in other formats. In some examples below, visual images are provided for purposes of explanation or for operator assisted processing, but digital images are typically used in computations.

In view of the many possible embodiments to which the principles of the disclosure may be applied, it should be recognized that the illustrated embodiments are only examples and should not be taken as limiting the scope of the disclosure.

We claim:

1. An apparatus comprising:
   an electron source coupled to provide an electron beam;
   a beam deflector arranged to provide a pulsed electron beam from the electron beam;
   a detector arranged to receive the pulsed electron beam after transmitting through a sample; and
   a controller coupled to control at least the beam deflector and the detector, the controller coupled to or including code that, when executed by the controller, causes the apparatus to:
   establish the pulsed electron beam with pulse characteristics based on control of at least the beam deflector, wherein an illumination window is formed based on the pulse characteristics, the illumination window being a time frame when the sample is illuminated with a pulse of the pulsed electron beam; and
   form a detection window for the detector and synchronize the detection window in relation to the illumination window, wherein detection events occurring in the detection window form the basis of an image, wherein the detection window determines a time frame when the detector converts the pulse of the pulsed electron beam transmitted through the sample to an electron induced signal.

2. The apparatus of claim 1, wherein the code that, when executed by the controller, causes the apparatus to synchronize a detection window of the detector with the illumination window further includes code that, when executed by the controller, causes the apparatus to:
   temporally space the detection window apart from the illumination window by at least a portion of a delay, the delay corresponding to a propagation time of a transmitted electron beam pulse propagating from the sample to the detector.

3. The apparatus of claim 2, wherein the delay is configured to suppress spurious signal detection not directly associated with a primary impact of the transmitted electron beam pulse.

4. The apparatus of claim 1, wherein the detector includes one or more single-photon avalanche photodiode (SPAD) detector elements.

5. The apparatus of claim 4, wherein the SPAD detector elements comprise a pixelated imager or a pixel array.

6. The apparatus of claim 2, wherein the detection events have respective timestamps and wherein the code that, when executed by the controller, causes the apparatus to:
   compare the timestamps of one or more of the detection events to delayed timestamps of one or more of the illumination windows, wherein the delayed timestamps correspond to the timestamps of the one or more illumination windows plus the delay; and
   associate with the image only those detection events that are within the delayed timestamps of the one or more illumination windows.

7. The apparatus of claim 2, wherein the detection events have respective timestamps and wherein the code that, when executed by the controller, causes the apparatus to:
   compare the timestamps of one or more of the detection events to timestamps of one or more of the detection windows; and
   associate with the image only those detection events that are within the timestamps of the one or more detection windows.

8. The apparatus of claim 2, wherein the code that, when executed by the controller, causes the apparatus to synchronize a detection window of the detector with the illumination window further includes code that, when executed by the controller, causes the apparatus to:
   temporally space a scatter-based detection window apart from the illumination window by at least a portion of a second delay, the second delay corresponding to an onset of scattered particles arriving at the detector, wherein detection events occurring in the scatter-based detection window form the basis of a scatter image.

9. The apparatus of claim 1, wherein the code that, when executed by the controller, causes the apparatus to synchronize a detection window of the detector with the illumination window further includes code that, when executed by the controller, causes the apparatus to:
   temporally space the detection window apart from the illumination window by at least a portion of a delay, the delay corresponding to an onset of scattered particles arriving at the detector, to form a scatter-window based detection window.

10. The apparatus of claim 1, wherein the code that, when executed by the controller, causes the apparatus to synchronize a detection window of the detector with the illumination window further includes code that, when executed by the controller causes the apparatus to:
    generate a signal with the detector only during the detection window.

11. The apparatus of claim 1, wherein the code that, when executed by the controller, causes the apparatus to synchronize a detection window of the detector with the illumination window further includes code that, when executed by the controller, causes the apparatus to:

terminate the detection window before particles scattered from surfaces of the apparatus in association with the transmission of the electron beam pulse during the illumination window become received by the detector.

12. The apparatus of claim 1, wherein the code that, when executed by the controller, causes the apparatus to synchronize a detection window of the detector with the illumination window further includes code that, when executed by the controller, causes the apparatus to:

provide the illumination window with a duration selected in relation to a delay between an onset of the detector receiving particles scattered from surfaces of the apparatus in association with the transmission of the electron beam pulse during the illumination window, such that an end of the detection window is selectable to occur before the onset.

13. The apparatus of claim 1, wherein the beam deflector is coupled to deflect the electron beam relative to an aperture to produce the pulsed electron beam at a pulse rate.

14. The apparatus of claim 13, wherein the beam deflector includes a resonant RF cavity.

15. The apparatus of claim 13, wherein the beam deflector is configured to provide the illumination windows with a duration of less than 1 ns, less than 500 ps, less than 100 ps, or less than 50 ps.

16. The apparatus of claim 1, wherein the beam deflector includes beam blankers.

17. The apparatus of claim 1, wherein the detector includes counter circuitry configured to record detected counts over a series of the detection windows.

18. The apparatus of claim 1, further comprising a pulse signal source coupled to or part of the controller, wherein the pulse signal source is configured to define pulse characteristics of the pulsed electron beam provided by the beam deflector.

19. A method, comprising:
providing an electron beam with an electron beam source;
producing a pulsed electron beam from the electron beam using a beam deflector;
establishing the pulsed electron beam with pulse characteristics based on control of at least the beam deflector, wherein the pulse an illumination window is formed based on the pulse characteristics, the illumination window being a time frame when a sample is illuminated with a pulse of the pulsed electron beam;
forming a detection window for a detector and synchronizing the detection window in relation to the illumination window, wherein detection events occurring in the detection window form the basis of an image, wherein the detection window determines a time frame when the detector converts the pulse of the pulsed electron beam transmitted through the sample to an electron induced signal; and
detecting the pulsed electron beam after transmission through the sample.

20. The method of claim 19, wherein the synchronizing the detection window includes temporally spacing apart the detection window from the illumination window by at least a portion of a delay corresponding to a propagation time of a transmitted electron beam pulse propagating from the sample to the detector.

21. A computer readable medium comprising computer executable instructions for a processor to, when providing an electron beam with an electron beam source and producing a pulsed electron beam from the electron beam using a beam deflector so that the pulsed electron beam is detected with a detector after transmission through a sample:

establish the pulsed electron beam with pulse characteristics based on control of at least the beam deflector, wherein an illumination window is formed based on the pulse characteristics, the illumination window being a time frame when the sample is illuminated with a pulse of the pulsed electron beam; and form a detection window for the detector and synchronize the detection window in relation to the illumination window, wherein detection events occurring in the detection window form the basis of an image, wherein the detection window determines a time frame when the detector converts the pulse of the pulsed electron beam transmitted through the sample to an electron induced signal.

* * * * *